United States Patent [19]
Counts

[11] Patent Number: 5,334,912
[45] Date of Patent: Aug. 2, 1994

[54] GROUND FAULT DETECTOR AND ASSOCIATED LOGIC FOR AN ELECTRONIC BALLAST

[75] Inventor: Richard C. Counts, Dallas, Tex.

[73] Assignee: USI Lighting, Inc., San Leandro, Calif.

[21] Appl. No.: 934,410

[22] Filed: Aug. 24, 1992

[51] Int. Cl.$^5$ ............................................. H05B 37/00
[52] U.S. Cl. ..................................... 315/119; 315/127; 315/225; 315/292; 315/313; 315/316
[58] Field of Search ............... 315/119, 127, 225, 292, 315/313, 316; 361/42

[56] References Cited

U.S. PATENT DOCUMENTS

| | | | |
|---|---|---|---|
| 4,954,960 | 9/1990 | Lo et al. | 364/484 |
| 5,065,074 | 11/1991 | Hesketh et al. | 315/209 R |

Primary Examiner—Robert J. Pascal
Assistant Examiner—Reginald A. Ratliff
Attorney, Agent, or Firm—Thomas E. Schatzel

[57] ABSTRACT

An embodiment of the present invention is a lighting system including a sense transformer with two primaries and a secondary for receiving alternating current (AC) from a power source, a low ohmage resistor placed across the sense transformer secondary winding for preventing saturation of the core of the sense transformer, an analog comparator for detecting when ground-fault signals in the sense transformer secondary winding exceed a threshold voltage and digital counters for testing whether or not a ground-fault condition persists longer than three consecutive half-cycles of the received alternating current from the power source.

6 Claims, 1 Drawing Sheet

GROUND FAULT DETECTOR AND ASSOCIATED LOGIC FOR AN ELECTRONIC BALLAST

BACKGROUND OF THE INVENTION

1. Field of the Invention

The present invention relates generally to electronic ballasts, and more specifically to cost effective ways of controlling ground-fault currents in an electronic ballast.

2. Description of the Prior Art

Incandescent lamps are relatively inexpensive compared to fluorescent lamp systems, but fluorescent lamps are more cost effective to operate because they can produce the same amount of light with much less electrical energy. A significant part of the initial cost of a fluorescent lamp system is the ballast. Fluorescent tubes express a negative resistance characteristic that must be controlled in order to maintain consistent light output and long life. Ballasts are also used to start the gaseous discharge tubes and to generate the required voltages, which are substantially higher than ordinary 110 VAC.

The use of integrated circuit technology has provided for lower cost of ballasts and therefore the cost of a fluorescent lamp system. Ballasts are produced in very high quantities and a savings of one or two dollars per ballast can account for millions of dollars of savings and can tip the balance between a choice of incandescent or fluorescent lights. Generally, increasing the number of functions integrated onto a chip lowers the cost of a ballast.

Electronic ballasts often require circuitry that limits potential shock currents from disconnected lamp pins. Industry standards such as Underwriters Laboratories (UL) specification #935 outline shock current limits, in terms of maximum magnitude and duration, which are tested through a resistor connected to earth ground. The resistor simulates some of the important electrical properties of the human body as a short circuit under worst case conditions.

A prior art method to limit such shock currents is to provide an isolation transformer in either the power input or output circuitry of a ballast. (For example, see, U.S. Pat. No. 4,277,726, issued to R.V. Burke.) Such a solution is costly and adds a great deal of bulk to a system. Even high-quality isolation transformers have an insertion loss and generate heat, such that they waste some electrical power, thereby defeating the principal benefit of a fluorescent lamp system.

On Mar. 26, 1985, O.K. Nilssen was issued U.S. Pat. No. 4,507,698, for an inverter type ballast with ground-fault protection. In FIG. 1 of Nilssen '698, a ground-fault transformer GFT has two primary and one secondary winding. Transformer GFT is described as being wound on a Magnetics OJ-41003-TC-00 ferrite torroidal core with fifteen turns of #30 wire for each primary winding and twenty-five turns of #34 for the secondary winding. A ground-fault is expressed as a net 33K Hz push-push current that induces a voltage in the secondary across a resistor R1 and energy storing capacitor EC. The turns ratio of transformer GFT and the value of resistor R1 are chosen to give the circuit a proper degree of sensitivity and freedom from false triggering.

On Jul. 3, 1990, O.K. Nilssen was issued U.S. Pat. No. 4,939,427, for a ground-fault protected series resonant ballast. This ballast has an EMI filter positioned between the inverter and power line which also acts to produce a control signal in case a ground-fault current occurs. In FIG. 2 of Nilssen '427, a winding AW on an inductor SI with a saturating core has to develop enough voltage across a diode Rc during a ground-fault condition to turn-on a transistor FET which, in turn, limits any ground-fault current. A storage capacitor SC maintains a ground-fault cutoff. A load resistor Rxy is connected across winding AW to desensitize the protection and raise the ground-fault current detection threshold.

The prior art ground-fault protection must be desensitized to noise and imbalanced currents that result during normal operation. Voltage transients can trigger the ground-fault protection and no mechanism is included to verify if a ground-fault condition exists.

Thus there is a need for a more sensitive method of ground-fault current detection and better immunity to stray transients in a ground-fault protected electronic ballast.

SUMMARY OF THE PRESENT INVENTION

It is therefore an object of the present invention to provide a ground-fault protected electronic ballast for sensitive ground-fault current detection and immunity to stray transients.

Briefly, an embodiment of the present invention is a lighting system including a sense transformer with two primaries and a secondary for receiving alternating current (AC) from a power source, a low ohmage resistor placed across the sense transformer secondary winding that prevents saturation of the core of the sense transformer, an analog comparator for detecting when ground-fault signals in the sense transformer secondary winding exceed a threshold voltage and digital counters for testing whether or not a ground-fault condition persists longer than three consecutive sixty Hz half-cycles.

An advantage of the present invention is that it provides a lighting system ballast that is more readily integrated into a semiconductor chip.

A further advantage of the present invention is that it provides non-noise sensitive ground-fault interruption.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
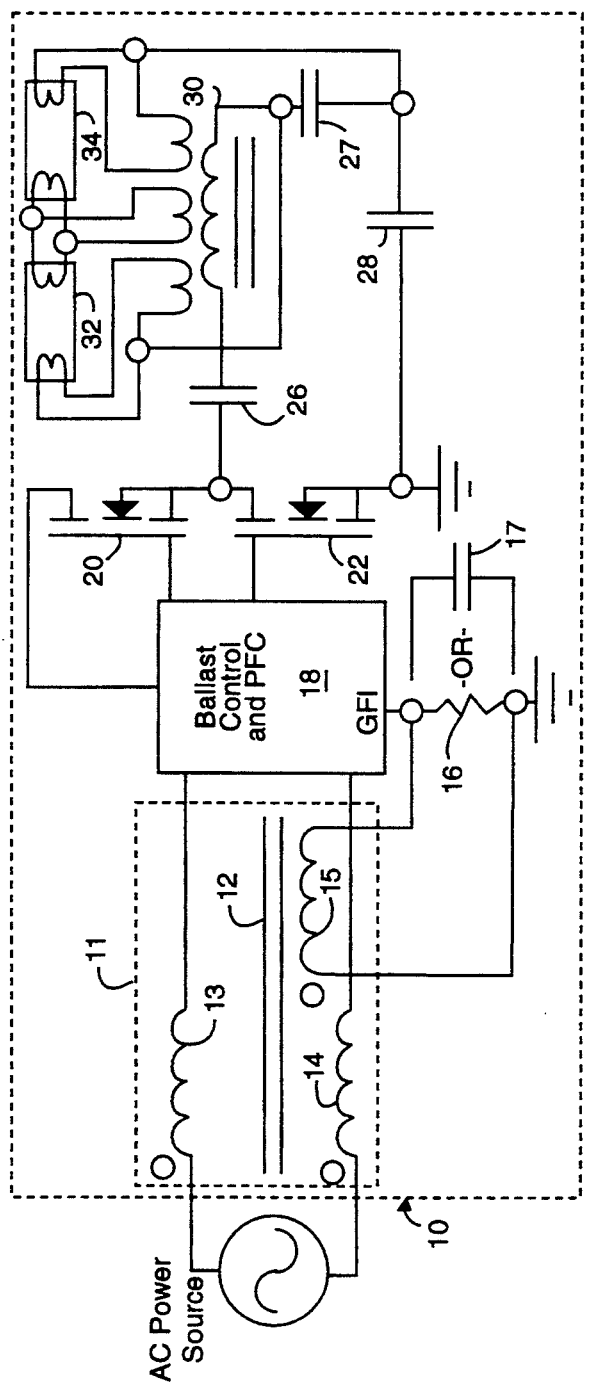
FIG. 1 is a simplified schematic diagram of a lighting system embodiment of the present invention.

FIG. 1 illustrates a fluorescent lighting system embodiment of the present invention, referred to by the general reference numeral 10, that comprises a sensing transformer 11 including a ferrite core 12, two primary windings 13 and 14 and one secondary winding 15; one of an anti-saturation resistor 16 or a capacitor 17; a ballast control and power factor correction unit 18; a pair of power switching transistors 20 and 22; a set of capacitors 26–28; an output transformer 30 and a pair of fluorescent lamps 32 and 34. Other kinds of gaseous discharge tubes can be used in place of fluorescent lamps 32 and 34. Transformer 11 is typically constructed from a 0.3 inch outside diameter (OD) ferrite core 12 with nine turns of trifilar wire for the windings 13–15. Resistor 16, typically 2.7 ohms, substantially shorts the output of transformer 11 at winding 15, thus preventing the core 12 of transformer 11 from saturating. If capacitor 17 is used instead of resistor 16, the impedance of the capacitor will have the same loading effect, but will, of course, be reduced at lower frequencies causing increased ground fault sensitivity to sixty Hz currents, for example. A typical value for capacitor 17 is 2.2 microfarads. Alternatively, an isolated shorted turn may be placed in proximity to core 12 for preventing saturation and resistor 16 may be made larger in value. Without this nearly shorted secondary winding, the ferrite core 12 would have to be substantially larger in bulk to avoid saturation. Therefore, an unusually small and inexpensive ferrite core 12 can be used in sensing transformer 11.

Figure 2:
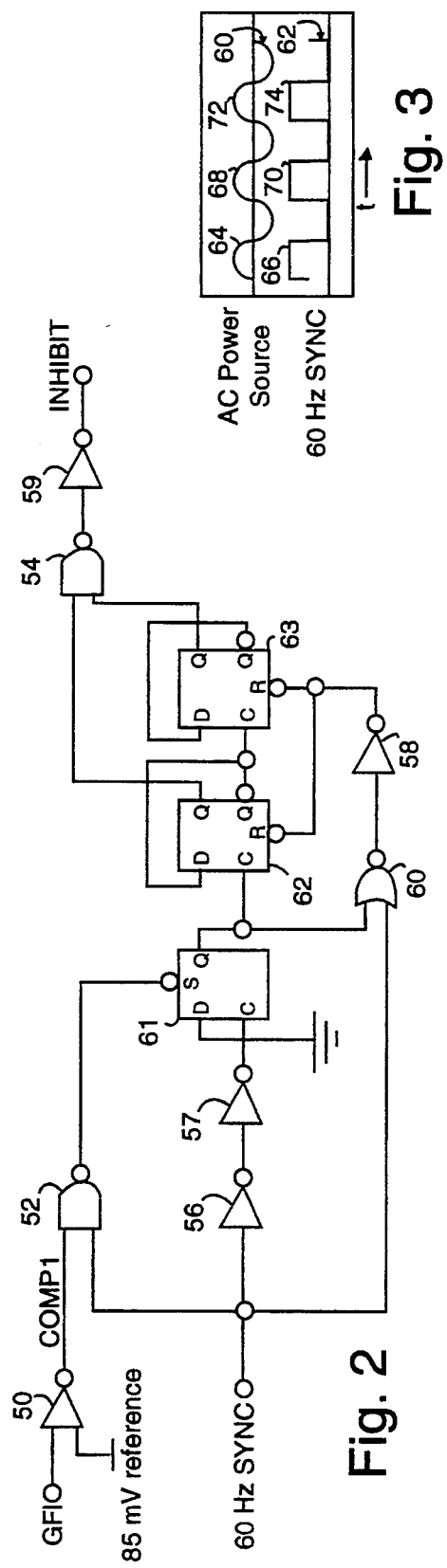
FIG. 2 is a schematic diagram of the ground-fault circuitry included within the ballast control of the system in FIG. 1.

FIG. 2 illustrates a ground-fault detector circuit that is included within ballast 18 (FIG. 1) and that comprises an analog voltage comparator 50, a pair of NAND-gates 52 and 54, a set of four inverters 56–59, a NOR-gate 60 and a cascade of flip-flops 61–63. If a current is allowed to flow from a disconnected pin of lamps 32 or 34 to earth ground, the resulting differential currents in primary windings 13 and 14 will generate a magnetic flux imbalance which, in turn, will create a voltage output at secondary winding 15. Since resistor 16 constitutes a near short circuit across secondary winding 15, the voltage output will be in the millivolt range when meaningful levels of ground-fault current are present in primary windings 13 and 14. The logic in FIG. 2 requires that any ground-fault current must persist above a minimum predetermined threshold for at least three consecutive sixty Hz half cycles.

Figure 3:
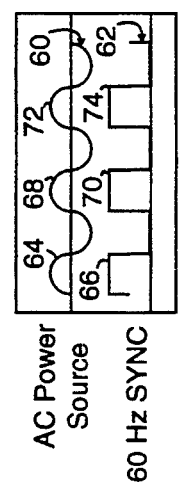
FIG. 3 is a diagram of the incoming AC power waveform and the synchronizing 60HZSYNC signal waveform.

FIG. 3 illustrates an incoming AC power source waveform 60 that is rectified and applied as a digital signal 60HZSYNC 62. Unit 18 provides the appropriate rectification and pulse shaping. An AC peak 64 produces a digital pulse 66. Three such consecutive digital pulses are counted by flip-flops 61–63 while the output of comparator 50 is high before a ground fault will be recognized. Random noise may trigger comparator 50 to output a high for less than three pulse periods.

To cope with the low output voltages of secondary winding 15 (FIG. 1), a threshold voltage of approximately 85 millivolts (mV) is fed to comparator 50. An INHIBIT signal will be generated at the output of inverter 59 that is used within unit 18 to squelch gate drive to transistors 20 and 22. Without power switching, output transformer 30 will not produce lamp current and therefore stop any ground-fault current from continuing.

The INHIBIT signal appears only after three consecutive sixty Hz half-cycles have passed through flip-flops 61–63. Comparator 50 must have had a high output during these three consecutive sixty Hz half-cycles in order for both inputs to NAND-gate 54 to go high. The counting of three consecutive half-cycles is important because that prevents random noise from turning the ballast off when there is no real shock current. The circuit may also be configured as a one or two half-cycle filter, or as a four or more cycle filter, without altering the basic concept. Of course, the circuit of FIGS. 1 and 2 would work well at any line frequency, not just sixty Hz.

This type of shock detector and shutdown circuit allows for low cost construction of sense transformer 11. The entire circuit illustrated in FIG. 2 may readily be integrated into a monolithic silicon integrated circuit, thereby saving on manufacturing cost.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A ground-fault detector for controlling shock potential in a fluorescent lamp system, the detector comprising:
   a sense transformer including a core, two primary windings and a secondary winding, said primary windings for passing through alternating current (AC) from a power source to a lamp ballast;
   a low impedance circuit element connected across said secondary winding for preventing a saturation of said core of the sense transformer;
   an analog comparator coupled across the low impedance circuit element for detecting when ground-fault signals in said secondary winding exceed a predetermined threshold voltage; and
   digital counter means connected to the analog comparator and configured to count the periods that a ground-fault condition persists as indicated by the analog comparator output assuming one of two possible states, and having means for outputting a disabling signal to shut off said fluorescent lamp system if said indication persists longer than three consecutive half-cycles of said AC power.

2. The detector of claim 1, wherein:
   the sense transformer includes a 0.3 inch outside diameter (OD) ferrite core with approximately nine turns of trifilar wire for said windings such that said core does not saturate during operation.

3. A ground-fault protected fluorescent lighting system, comprising:
   an output network including a transformer for driving at least one fluorescent lamp;
   a pair of power switching transistors for alternating current through said transformer at a rate near the natural resonant frequency of the output network;
   a ballast for driving the gates of the power switching transistors at a rate near the natural resonant frequency of the output network;
   a sense transformer including a core, two primary windings and a secondary winding, said primary windings for passing through alternating current (AC) from a power source to the ballast and said fluorescent lamps; and
   ground-fault means coupled to the ballast and the sense transformer and including line cycle period counting means for determining when a ground-fault induced voltage in said secondary winding exceeds a predetermined analog voltage threshold for a predetermined minimum time as counted in line cycle periods and for disabling the ballast such that a ground-fault in the output network will be interrupted.

4. A ground-fault detector for controlling shock potential in fluorescent lamp systems, the detector comprising:
- a sense transformer including a core, two primary windings and a secondary winding, said primary windings for passing through alternating current (AC) from a power source to a lamp ballast;
- a low impedance circuit element which comprises one of a resistor approximately 2.7 ohms and a capacitor approximately 2.2 microfarads placed across said secondary winding for preventing saturation of said core of the sense transformer;
- an analog comparator coupled across the low impedance circuit element for detecting when ground-fault signals in said secondary winding exceed a predetermined threshold voltage; and
- digital counter means for testing whether or not an output from the analog comparator indicates that a ground-fault condition has persisted longer than three consecutive half-cycles of said AC power.

5. A ground-fault protected fluorescent lighting system, comprising:
- an output network including a transformer for driving at least one florescent lamp;
- a pair of power switching transistors for alternating current through said transformer at a rate near the natural resonant frequency of the output network;
- a ballast for driving the gates of the power switching transistors at a rate near the natural resonant frequency of the output network;
- a sense transformer including a core, two primary windings and a secondary winding, said primary windings for passing through alternating current (AC) from a power source to the ballast and said florescent lamps; and
- ground-fault means for determining when the voltage in said secondary winding exceeds a predetermined analog voltage threshold for a predetermined minimum time and for disabling the ballast such that a ground-fault in the output network will be interrupted, and including:
  - a low ohmage resistor placed across said secondary winding such that the resistor's low impedance prevents saturation of said core of the sense transformer by operating currents flowing to the output network;
  - an analog comparator coupled across the resistor for detecting when ground-fault signals in said secondary winding exceed a predetermined threshold voltage; and
  - digital counter means for testing whether or not an output from the analog comparator indicates that a ground-fault condition has persisted longer than three consecutive half-cycles of said AC power.

6. A ground-fault protected fluorescent lighting system, comprising:
- an output network including a transformer for driving at least one fluorescent lamp;
- a pair of power switching transistors for alternating current through said transformer at a rate near the natural resonant frequency of the output network;
- a ballast for driving the gates of the power switching transistors at a rate near the natural resonant frequency of the output network;
- a sense transformer including a core, two primary windings and a secondary winding, said primary windings for passing through alternating current (AC) from a power source to the ballast and said florescent lamps; and
- ground-fault means for determining when the voltage in said secondary winding exceeds a predetermined analog voltage threshold for a predetermined minimum time and for disabling the ballast such that a ground-fault in the output network will be interrupted, and including:
  - a low impedance capacitor placed across said secondary winding such that the capacitor's impedance prevents saturation of said core of the sense transformer by operating currents flowing to the output network;
  - an analog comparator coupled across the capacitor for detecting when ground-fault signals in said secondary winding exceed a predetermined threshold voltage; and
  - digital counter means for testing whether or not an output from the analog comparator indicates that a ground-fault condition has persisted longer than three consecutive half-cycles of said AC power.

* * * * *